United States Patent
Tamura et al.

(10) Patent No.: US 11,453,940 B2
(45) Date of Patent: *Sep. 27, 2022

(54) METAL MASK SUBSTRATE FOR VAPOR DEPOSITION, METAL MASK FOR VAPOR DEPOSITION, PRODUCTION METHOD FOR METAL MASK SUBSTRATE FOR VAPOR DEPOSITION, AND PRODUCTION METHOD FOR METAL MASK FOR VAPOR DEPOSITION

(71) Applicant: TOPPAN PRINTING CO., LTD., Tokyo (JP)

(72) Inventors: Sumika Tamura, Tokyo (JP); Mikio Shinno, Tokyo (JP); Daisei Fujito, Tokyo (JP); Kiyoaki Nishitsuji, Tokyo (JP); Takehiro Nishi, Tokyo (JP); Naoko Mikami, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/013,535

(22) Filed: Sep. 4, 2020

(65) Prior Publication Data

US 2020/0399770 A1 Dec. 24, 2020

Related U.S. Application Data

(63) Continuation of application No. 15/786,455, filed on Oct. 17, 2017, now Pat. No. 10,876,215, which is a
(Continued)

(30) Foreign Application Priority Data

Jul. 17, 2015 (JP) .................................. 2015-143509
Aug. 31, 2015 (JP) .................................. 2015-171440
Apr. 11, 2016 (JP) .................................. 2016-079099

(51) Int. Cl.
*C23C 14/04* (2006.01)
*C25D 1/04* (2006.01)
(Continued)

(52) U.S. Cl.
CPC .......... *C23C 14/042* (2013.01); *C25B 11/055* (2021.01); *C25C 1/08* (2013.01);
(Continued)

(58) Field of Classification Search
CPC ..... C25B 11/055; C23C 14/042; C23C 14/24; C25D 1/04; C25D 1/10; C25D 5/16;
(Continued)

(56) References Cited

U.S. PATENT DOCUMENTS 3,160,752 A 12/1964 Bennett
6,620,554 B1 9/2003 Komatsu et al.
(Continued)

FOREIGN PATENT DOCUMENTS

CN 1534383 A 10/2004
CN 1793433 A 6/2006
(Continued)

OTHER PUBLICATIONS

Bennett et al., "Relation Between Surface Roughness and Specular Reflectance at Normal Incidence," J Opt Soc Am. Feb. 1961, 16 pages; 51(2):123-129.
(Continued)

*Primary Examiner* — Nathan L Van Sell
(74) *Attorney, Agent, or Firm* — Squire Patton Boggs (US) LLP

(57) ABSTRACT

A vapor deposition metal mask substrate includes a nickel-containing metal sheet including a obverse surface and a reverse surface, which is opposite to the obverse surface. At least one of the obverse surface and the reverse surface is a target surface for placing a resist layer. The target surface
(Continued)

has a surface roughness Sa of less than or equal to 0.019 μm. The target surface has a surface roughness Sz of less than or equal to 0.308 μm.

9 Claims, 4 Drawing Sheets

Related U.S. Application Data continuation of application No. PCT/JP2016/070951, filed on Jul. 15, 2016.

(51) Int. Cl.
| | | |
|---|---|---|
| C25B 11/055 | (2021.01) | |
| C25C 1/08 | (2006.01) | |
| C25C 7/08 | (2006.01) | |
| C25D 1/10 | (2006.01) | |
| C25D 11/34 | (2006.01) | |
| H01L 51/00 | (2006.01) | |
| C25D 3/56 | (2006.01) | |

(52) U.S. Cl.
CPC .......... C25C 7/08 (2013.01); C25D 1/04 (2013.01); C25D 1/10 (2013.01); C25D 11/34 (2013.01); C25D 3/562 (2013.01); H01L 51/0011 (2013.01)

(58) Field of Classification Search
CPC .......... C25D 11/34; C25D 3/562; C25D 1/00; C25C 1/08; C25C 7/08; H01L 51/0011; H01L 51/56; C23F 1/02
See application file for complete search history.

(56) References Cited

U.S. PATENT DOCUMENTS

| | | | |
|---|---|---|---|
| 2002/0110743 | A1 | 8/2002 | Shoki et al. |
| 2003/0221613 | A1 | 12/2003 | Kang et al. |
| 2004/0018372 | A1 | 1/2004 | Komatsu et al. |
| 2004/0175633 | A1 | 9/2004 | Shoki et al. |
| 2004/0202821 | A1 | 10/2004 | Kim et al. |
| 2004/0224526 | A1 | 11/2004 | Shoki |
| 2006/0103289 | A1 | 5/2006 | Kim et al. |
| 2007/0072337 | A1 | 3/2007 | Matsuzaki et al. |
| 2008/0277157 | A1 | 11/2008 | Naito et al. |
| 2011/0027461 | A1 | 2/2011 | Matsudate et al. |
| 2012/0019618 | A1 | 1/2012 | Lim et al. |
| 2013/0263749 | A1 | 10/2013 | Kernig et al. |
| 2014/0377903 | A1 | 12/2014 | Takeda et al. |
| 2016/0049586 | A1 | 2/2016 | Takeda et al. |
| 2016/0208392 | A1 | 7/2016 | Ikenaga et al. |
| 2016/0268511 | A1 | 9/2016 | Takeda et al. |
| 2016/0293844 | A1 | 10/2016 | Takeda et al. |
| 2017/0141315 | A1 | 5/2017 | Ikenaga |
| 2017/0186955 | A1 | 6/2017 | Takeda et al. |
| 2018/0038002 | A1 | 2/2018 | Tamura et al. |
| 2018/0065162 | A1 | 3/2018 | Mikami et al. |
| 2018/0138410 | A1 | 5/2018 | Fujito et al. |

FOREIGN PATENT DOCUMENTS

| | | |
|---|---|---|
| CN | 102851638 A | 1/2013 |
| CN | 103205680 A | 7/2013 |
| DE | 198 52 299 A1 | 5/1999 |
| JP | H04-314535 A | 11/1992 |
| JP | H05-290724 A | 11/1993 |
| JP | H09-199812 A | 7/1997 |
| JP | H09-209176 A | 8/1997 |
| JP | H11-140667 A | 5/1999 |
| JP | H11-260255 A | 9/1999 |
| JP | 2002-151841 A | 5/2002 |
| JP | 2002-219505 A | 8/2002 |
| JP | 2002-246712 A | 8/2002 |
| JP | 2002-319542 A | 10/2002 |
| JP | 2004-218034 A | 8/2004 |
| JP | 2004-276435 A | 10/2004 |
| JP | 2005-076068 A | 3/2005 |
| JP | 2009-108362 A | 5/2006 |
| JP | 2006-233285 A | 9/2006 |
| JP | 2007-095324 A | 4/2007 |
| JP | 2008-041553 A | 2/2008 |
| JP | 2009-052072 A | 3/2009 |
| JP | 2009-127105 A | 6/2009 |
| JP | 2010-214447 A | 9/2010 |
| JP | 2011-034681 A | 2/2011 |
| JP | 2011-166018 A | 8/2011 |
| JP | 2012-087338 A | 5/2012 |
| JP | 2012-103425 A | 5/2012 |
| JP | 2012-158645 A | 8/2012 |
| JP | 2012-243454 A | 12/2012 |
| JP | 2013-209710 A | 10/2013 |
| JP | 2013-542327 A | 11/2013 |
| JP | 2013-245392 A | 12/2013 |
| JP | 5382259 B1 | 1/2014 |
| JP | 2014-101543 A | 6/2014 |
| JP | 2014-133375 A | 7/2014 |
| JP | 2014-148758 A | 8/2014 |
| JP | 2014-208910 A | 11/2014 |
| JP | 5641462 B1 | 12/2014 |
| JP | 2015-036436 A | 2/2015 |
| JP | 2015-052167 A | 3/2015 |
| JP | 2015-54998 A | 3/2015 |
| JP | 2015-055007 A | 3/2015 |
| JP | 2015-117432 A | 6/2015 |
| JP | 2015-127441 A | 7/2015 |
| JP | 2015-127446 A | 7/2015 |
| JP | 2015-129333 A | 7/2015 |
| JP | 2015-129334 A | 7/2015 |
| JP | 2017-181894 A | 10/2017 |
| KR | 10-1995-0014366 A | 6/1995 |
| KR | 2003-0092790 A | 12/2003 |
| KR | 10-2006-0043962 A | 5/2006 |
| WO | WO 2013/105643 A1 | 7/2013 |
| WO | WO 2014/038510 A1 | 3/2014 |

OTHER PUBLICATIONS

First Office Action for Chinese Patent Application No. 201811311762. 8, dated Apr. 27, 2020, with English Translation, 26 pages.

Hishikawa et al., "Rolling Technology for Aluminum Sheet and Plate", Furukawa—Sky Review No. 4. Year: 2008, English abstract included, 10 pages.

Hui Wenhua et al. "Tribology and Wear Resistance Design", with concise Explanation of Relevance, pp. 488-489, Nov. 1993.

International Organization for Standardization, *Geometrical product specifications (GPS)—Surface texture: Areal*, ISO 25178-2:2012(E), pp. iv and 9.

International Preliminary Report on Patentability (IPRP) dated Jan. 23, 2018, with International Search Report (ISR) and Translation of IPRP and ISR for International Patent Application No. PCT/JP2016/069350, 19 pages.

International Preliminary Report on Patentability (IPRP) dated Jan. 23, 2018, with International Search Report (ISR) and Translation of IPRP and ISR for International Patent Application No. PCT/JP2016/070951, 21 pages.

International Preliminary Report on Patentability (IPRP) dated Jan. 23, 2018, with International Search Report (ISR) and Translation of IPRP and ISR for International Patent Application No. PCT/JP2016/059041, 28 pages.

Japanese Office Action, Notice of Reasons for Refusal, Japanese Patent Application No. 2019-127917, dated Aug. 25, 2020, with English translation, 10 pages.

Japanese Standards Association, *Definitions and Designation of Surface Roughness*, JIS B 0601: 1982, 20 pages.

Japanese Standards Association, *Geometrical Product Specifications (GPS)—Surface texture: Profile method—Terms, definitions and surface texture parameters*, JIS B 0601: 2001, 33 pages.

(56) References Cited

OTHER PUBLICATIONS

Non-Final Office Action dated Aug. 20, 2019, in U.S. Appl. No. 15/786,455, 19 pages.
Non-Final Office Action dated Aug. 10, 2018, in U.S. Appl. No. 15/786,463, 8 pages.
Non-Final Office Action dated Nov. 7, 2019, in U.S. Appl. No. 15/869,597, 15 pages.
Notification of Reasons for Refusal dated May 7, 2018, in Japanese Patent Application No. 2017-529473, 5 pages.
Office Action dated Feb. 26, 2018, in Taiwanese Patent Application No. 10720169960, 6 pages.
Office Action dated Mar. 15, 2018, in Chinese Patent Application No. 201680013003.6, 7 pages.
Office Action dated Mar. 2, 2018, in Chinese Patent Application No. 201680012997.X, 11 pages.
Second Office Action dated Sep. 23, 2019, in Chinese Patent Application No. 201610561108.7, 17 pages.
The Third Office Action for Chinese Patent Application No. 201610561108.7, dated Jun. 3, 2020, with English Translation, 42 pages.
Third Party Observations filed with the German Patent and Trademark Office on Apr. 24, 2019, against German Patent Application No. DE 11 2016 003 225.0, 38 pages.
Tsukada and Kanada, "Evaluation of Two- and Three-Dimensional Surface Roughness Profiles and Their Confidence", Wear. 1986; 109: 69-78.
Xu Qiangling, "Plating (Coating) Layer Quality Inspection Technology", with concise Explanation of Relevance, pp. 29-32, Jul. 1992.
Notification of Reason for Refusal, issued by the Japanse Intellectual Property Office for Japanese Patent Application No. JP 2019-127917, dated Mar. 16, 2021, with translation, 8 pages.
Third Chinese Office Action, for Chinese Patent Application CN 201680041439.6, dated Oct. 19, 2020, with English Translation, 40 pages.
Mo Yunqi, "Research on Maunfacturing Process of COF Flexible Printed Board for LCD and PCB Failure Analysis", University of Electronic Science and Technology of China, Chengdu China, English Abstract translation, 5 pages, Oct. 19, 2009.
Yoshida et al. "Evaluation Parameters of Surface Texture on Shot-Blasted Surfaces", Journal of the Japan Institute of Light Metals, English abstract with translation, 5 pages, vol. 61, No. 5 (May 31, 2011):187-191.
Photofabrication Practical Introductory Reader (8th Edition) and Excerpt Korean Translation (Examination Reference Material No. 3), Jun. 2008, Japan Photofabrication Association, with partial English Translation, 26 pages.
Notification of Reason for Refusal, Korean Patent Application No. 10-2018-7028175, dated Jul. 10, 2021, with English translation, 9 pages.
Notice of Reasons for Refusal, Japanese Patent Application No. 2020-199747, dated Jan. 6, 2022, with English translation, 4 pages.
Second Office Action dated Aug. 16, 2021 in Chinese Patent Application No. 201910317040.1, with English translation, 12 pages.
Rejection Decision dated Jan. 19, 2022 in Chinese Patent Application No. 201910317040.1, with English translation, 16 pages.
"Handbook for Processing Heavy Non-Ferrous Metals, vol. 2", "Handbook for Processing Heavy Non-Ferrous Metals", p. 24, Metallurgical Industry Press, published on Apr. 30, 1974, with English translation, 8 pages.
Notice of Reasons for Revocation drafted Aug. 30, 2019 in Japanese Patent Application No. 2017-529473, with English translation, 44 pages.
Notice of Reasons for Revocation drafted Jan. 17, 2020 in Japanese Patent Application No. 2017-529473, with English translation, 59 pages.
Decision to Revoke Patent (Decision on Patent Opposition) dated Jul. 20, 2021 in Korean Patent Application No. 10-2018-7004187, with English translation, 52 pages.
Illustration and photo fabrication, with partial English translation, 28 pages.
Notification of Third Party Submission dated Jun. 21, 2022 for Japanese Patent Application No. 2021-011018, with Englisht translation, 17 pages.
Notice of Reasons for Refusal dated Jul. 5, 2022 for Japanese Patent Application No. 2020-199747, with Englis translation, 4 pages.
Notice of Reasons for Refusal dated Aug. 2, 2022 for Japanese Patent Application No. 2021-011018, with English translation, 6 pages.

Fig.7

| Test example | Production method | Ni/Fe | Arithmetical mean height Surface roughness Sa(μm) | Maximum height Surface roughness Sz(μm) | Reflectance R (%) 45° | Two axes reflectance difference (%) |
|---|---|---|---|---|---|---|
| 1 | Electrolysis | 63.7/36.3 | 0.011 | 0.265 | 90.4 | 2.5 |
| 2 | Electrolysis | 42.7/57.3 | 0.014 | 0.240 | 97.0 | 2.7 |
| 3 | Electrolysis | 38.4/61.6 | 0.019 | 0.308 | 74.2 | 2.5 |
| 4 | Rolling and polishing | 36.0/64.0 | 0.013 | 0.179 | 76.2 | - |
| 5 | Rolling and polishing | 36.0/64.0 | 0.013 | 0.136 | 75.4 | 3.6 |
| 6 | Electrolysis | 37.2/62.8 | 0.019 | 0.259 | 67.5 | 6.5 |
| 7 | Electrolysis | 50.0/50.0 | 0.009 | 0.017 | - | - |
| 8 | Rolling | 36.0/64.0 | 0.038 | 0.351 | 50.0 | - |
| 9 | Rolling | 36.0/64.0 | 0.041 | 0.427 | 52.9 | 6.2 |

METAL MASK SUBSTRATE FOR VAPOR DEPOSITION, METAL MASK FOR VAPOR DEPOSITION, PRODUCTION METHOD FOR METAL MASK SUBSTRATE FOR VAPOR DEPOSITION, AND PRODUCTION METHOD FOR METAL MASK FOR VAPOR DEPOSITION

CROSS-REFERENCE TO RELATED APPLICATION

This application is a continuation of application Ser. No. 15/786,455, filed Oct. 17, 2017, which is a continuation of International Application No. PCT/JP2016/070951 filed on Jul. 15, 2016, which claims priority to Japanese Application No. JP 2016-079099 filed on Apr. 11, 2016, Japanese Application No. JP 2015-171440 filed Aug. 31, 2015, and Japanese Application No. JP 2015-143509 filed Jul. 17, 2015, all of which are incorporated verbatim herein by reference in their entirety, including the specifications, drawings and claims.

BACKGROUND

The present disclosure relates to a vapor deposition metal mask substrate, a vapor deposition metal mask, a method for manufacturing a vapor deposition metal mask substrate, and a method for manufacturing a vapor deposition metal mask.

Organic EL displays are display devices that are known to be manufactured by vapor deposition. An organic EL display includes an organic layer, which is a deposit of organic molecules sublimed in the vapor deposition process. Vapor deposition metal masks used in the vapor deposition process have mask holes serving as passages of sublimed organic molecules to the substrate. The openings of the mask holes are shaped corresponding to the shape of pixels of the organic EL display (see Japanese Laid-Open Patent Publication No. 2015-055007 for example).

A method for manufacturing a vapor deposition metal mask includes a step of forming openings in a vapor deposition metal mask substrate. The step of forming the openings may include forming a resist mask by photolithography and wet etching using the resist mask. In forming the resist mask, the exposure region of the resist layer on the surface of the vapor deposition metal mask substrate is exposed to light. At least part of the light incident on the resist layer scatters on the surface of the vapor deposition metal mask substrate, and part of the scattering light falls on the non-exposure region of the resist layer. As a result, when a negative resist material is used for the resist layer, the scattering of light leaves residues of the resist material. When a positive resist material is used for the resist layer, the scattering of light forms a missing part in the resist mask. This may increase the difference between the structure of the resist mask that is actually formed and the designed resist mask structure, thereby increasing the difference between the structure of openings formed by wet etching and the designed opening structure.

SUMMARY

It is an objective of the present disclosure to provide a vapor deposition metal mask substrate, a vapor deposition metal mask, a method for manufacturing a vapor deposition metal mask substrate, and a method for manufacturing a vapor deposition metal mask that increase the structural accuracy of the openings of the vapor deposition metal mask.

To achieve the foregoing objective and in accordance with one aspect of the present disclosure, a vapor deposition metal mask substrate is provided that includes a nickel-containing metal sheet including an obverse surface and a reverse surface, which is opposite to the obverse surface. At least one of the obverse surface and the reverse surface is a target surface for placing a resist layer. The target surface has a surface roughness Sa of less than or equal to 0.019 μm. The target surface has a surface roughness Sz of less than or equal to 0.308 μm. In the vapor deposition metal mask substrate, a specular reflectance of incident light to the target surface may be between 53.0% and 97.0%, inclusive. Also, in the vapor deposition metal mask substrate, the nickel-containing metal sheet may be an invar sheet.

To achieve the foregoing objective and in accordance with one aspect of the present disclosure, a vapor deposition metal mask substrate is provided that includes a nickel-containing metal sheet including an obverse surface and a reverse surface, which is opposite to the obverse surface. At least one of the obverse surface and the reverse surface is a target surface for placing a resist layer. A specular reflectance of incident light to the target surface is between 53.0% and 97.0%, inclusive.

To achieve the foregoing objective and in accordance with one aspect of the present disclosure, a method for manufacturing a vapor deposition metal mask substrate is provided. The method includes: forming a nickel-containing metal sheet on an electrode surface by electrolysis; and separating the nickel-containing metal sheet from the electrode surface. The nickel-containing metal sheet includes an obverse surface and a reverse surface, which is opposite to the obverse surface. At least one of the obverse surface and the reverse surface is a target surface for placing a resist layer. The electrolysis causes the target surface to have a surface roughness Sa of less than or equal to 0.019 μm and causes the target surface to have a surface roughness Sz of less than or equal to 0.308 μm.

To achieve the foregoing objective and in accordance with one aspect of the present disclosure, a method for manufacturing a vapor deposition metal mask substrate is provided. The method includes: forming a nickel-containing metal sheet on an electrode surface by electrolysis; and separating the nickel-containing metal sheet from the electrode surface. The nickel-containing metal sheet includes an obverse surface and a reverse surface, which is opposite to the obverse surface. At least one of the obverse surface and the reverse surface is a target surface for placing a resist layer. The electrolysis causes a specular reflectance of incident light to the target surface to be between 53.0% and 97.0%, inclusive.

To achieve the foregoing objective and in accordance with one aspect of the present disclosure, a method for manufacturing a vapor deposition metal mask is provided. The method includes: forming a resist mask on a target surface of a vapor deposition metal mask substrate; and etching the target surface by wet etching using the resist mask, The structures described above limit scattering of light on the target surface for placing a resist mask. Consequently, the difference between the structure of the resist mask formed by exposure and development and the designed resist mask structure is reduced. This enhances the structural accuracy of the openings of the vapor deposition metal mask. When the nickel-containing metal sheet is an invar sheet, the target surface is made of invar, which is a metal material having a small thermal expansion coefficient. This limits structural change of the vapor deposition metal mask, which would otherwise be caused by the heat applied during vapor deposition.

To achieve the foregoing objective and in accordance with one aspect of the present disclosure, a vapor deposition metal mask is provided that includes a mask portion composed of a nickel-containing metal sheet. The mask portion includes an obverse surface including an obverse surface opening and a reverse surface including a reverse surface opening in communication with the obverse surface opening, the reverse surface being opposite to the obverse surface. At least one of the obverse surface and the reverse surface is a target surface. The target surface has a surface roughness Sa of less than or equal to 0.019 µm. The target surface has a surface roughness Sz of less than or equal to 0.308 µm. In the vapor deposition metal mask, a specular reflectance of incident light to the target surface may be between 53.0% and 97.0%, inclusive.

To achieve the foregoing objective and in accordance with one aspect of the present disclosure, a vapor deposition metal mask is provided that includes a mask portion composed of a nickel-containing metal sheet. The mask portion includes an obverse surface including an obverse surface opening and a reverse surface including a reverse surface opening in communication with the obverse surface opening, the reverse surface being opposite to the obverse surface. At least one of the obverse surface and the reverse surface is a target surface. A specular reflectance of incident light to the target surface is between 53.0% and 97.0%, inclusive.

The structures described above limit scattering of light on the target surface. Thus, when the resist mask is formed on the target surface and openings are formed, the difference between the structure of the resist mask formed by exposure and development and the designed resist mask structure is reduced on the target surface. This enhances the structural accuracy of the openings of the vapor deposition metal mask.

In the above-described vapor deposition metal mask, the target surface may include at least the obverse surface, and the obverse surface opening may be an opening for passage of vapor deposition particles from the obverse surface opening toward the reverse surface opening and may be larger than the reverse surface opening.

The vapor deposition metal mask has the obverse surface openings that are larger than the reverse surface openings and therefore limits the shadow effect of the vapor deposition particles entering through the obverse surface openings. When holes are formed in the substrate for manufacturing the mask portions, of the obverse surface and the reverse surface, the surface that is etched to a greater degree has larger openings than the surface that is etched to a lesser degree. Since the vapor deposition metal mask has the obverse surface openings that are larger than the reverse surface openings, the degree of etching on the obverse surface is greater than the degree of etching on the reverse surface. The obverse surface of the vapor deposition metal mask serves as the target surface. Thus, the vapor deposition metal mask may be manufactured by forming a resist mask on the obverse surface and etching the vapor deposition metal mask substrate from the obverse surface. Such a method enhances the structural accuracy of the openings of the vapor deposition metal mask.

In the above-described vapor deposition metal mask, the nickel-containing metal sheet may be an invar sheet. The target surface of the vapor deposition metal mask is made of invar, which is a metal material having a small thermal expansion coefficient. This limits structural change of the vapor deposition metal mask, which would otherwise be caused by the heat applied during vapor deposition.

In each of the above-described configuration, two directions that are perpendicular to each other in the target surface may be directions in which light is incident as viewed facing the target surface, and a difference in the reflectance between the two directions may be less than or equal to 3.6%. This structure enhances the structural accuracy of the openings of the vapor deposition metal mask in the two-dimensional directions in the target surface.

BRIEF DESCRIPTION OF THE DRAWINGS

FIG. 7 is a diagram showing the relationship of the method for manufacturing a vapor deposition metal mask substrate to the surface roughness of the flat surface and the reflectance in each test example.

DESCRIPTION OF EXEMPLARY EMBODIMENTS

One embodiment of a vapor deposition metal mask substrate, a vapor deposition metal mask, a method for manufacturing a vapor deposition metal mask substrate, and a method for manufacturing a vapor deposition metal mask is now described. First, referring to FIGS. 1 to 5, the structure of the vapor deposition metal mask substrate and the structure of the vapor deposition metal mask are described. Then, the method for manufacturing the vapor deposition metal mask is described referring to FIG. 6, and advantages achieved by the surface texture of the vapor deposition metal mask substrate are described referring to FIGS. 7 and 8.

[Vapor Deposition Metal Mask Substrate]

Figure 1:
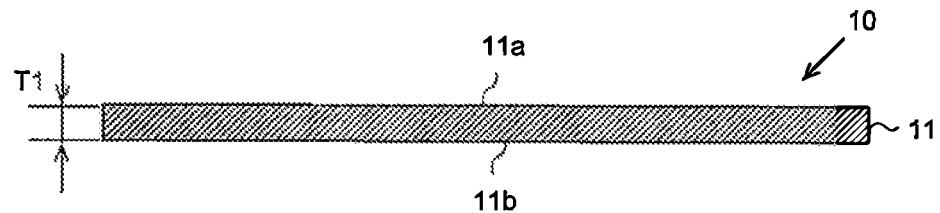
FIG. 1 is a cross-sectional view showing the cross-sectional structure of an example of a vapor deposition metal mask substrate of one embodiment.

As shown in FIG. 1, a vapor deposition metal mask substrate 10 is composed of a nickel-containing metal sheet 11. The nickel-containing metal sheet 11 includes a substrate obverse surface 11a and a substrate reverse surface 11b, which is opposite to the substrate obverse surface 11a. At least one of the substrate obverse surface 11a and the substrate reverse surface 11b is a target surface for placing a resist layer. The target surface is the surface on which a resist mask is formed in the process of forming a vapor deposition metal mask.

The nickel-containing metal sheet 11 may be made of nickel or a nickel-iron alloy, such as a nickel-iron alloy containing 30 mass % or more of nickel. Specifically, the nickel-containing metal sheet 11 may be made of invar, which is mainly composed of an alloy containing 36 mass % of nickel and 64 mass % of iron. The nickel-iron alloy forming the nickel-containing metal sheet 11 may include materials such as manganese, carbon, chromium, copper, silicon, magnesium, or cobalt as a minor component. When the nickel-containing metal sheet 11 is an invar sheet, the thermal expansion coefficient of the nickel-containing metal sheet 11 is about $1.2\times10^{-6}/°$ C., for example. When the nickel-containing metal sheet 11 has such a thermal expansion coefficient, the degree of thermal expansion of the vapor deposition metal mask that is manufactured using the vapor deposition metal mask substrate 10 matches the degree of thermal expansion of a glass substrate. Thus, a glass substrate can be suitably used as the target of vapor deposition.

The nickel-containing metal sheet 11 has a thickness T1 of between 1 μm and 100 μm, inclusive, preferably between 2 μm and 40 μm, inclusive. When the thickness T1 of the nickel-containing metal sheet 11 is less than or equal to 40 μm, the nickel-containing metal sheet 11 has holes of a depth of less than or equal to 40 μm. When a vapor deposition metal mask is manufactured using the vapor deposition metal mask substrate 10 that includes the nickel-containing metal sheet 11 having such a thickness T1, the vapor deposition metal mask reduces the area in the deposition target to which deposition particles cannot adhere due to the presence of the vapor deposition metal mask (the shadow area) as viewed from the deposition particles traveling toward the vapor deposition metal mask. In other words, the shadow effect is reduced.

The surface texture of the target surface of the nickel-containing metal sheet 11 satisfies at least one of [Condition 1] and [Condition 2] below.

[Condition 1] Surface Roughness Sa≤0.019 μm, and Surface Roughness Sz≤0.308 μm

[Condition 2] 53.0%≤Reflectance R of the Target Surface≤97.0%

The surface roughness Sa and the surface roughness Sz are values obtained by a method according to ISO 25178. The reflectance R is determined using Expression (1) below and by measuring the specular reflection light that is reflected when light from a halogen lamp is incident on the target surface. The light emitted from the halogen lamp is incident on a region of 14 mm² in the target surface at an angle of 45°±0.2° to the direction of the normal to the target surface. The element that receives the reflection light has an area of 11.4 mm². The reflectance R is measured in three different sections in the target surface. The reflectance R of the target surface is the average of the reflectances R obtained in the sections of the target surface. In each section, light rays emitted from two directions that are perpendicular to each other as viewed facing the target surface are used to measure the reflectance R. The reflectance R is measured separately for each direction. When a nickel-containing metal sheet 11 that is formed only by rolling the base material is measured, one of the directions of the light incident on the target surface as viewed facing the target surface is the same as the direction in which the base material is rolled.

$$R=[\text{amount of specular reflection light}/\text{amount of incident light}]\times 100 \quad (1)$$

The surface texture that satisfies at least one of [Condition 1] and [Condition 2] limits scattering of incident light on the target surface. When light is incident on the resist layer on the target surface, such a surface texture reduces the likelihood that part of the light scatters on the target surface and falls on the non-exposure region of the resist layer. Consequently, the difference between the structure of the resist mask formed by exposure and development and the designed resist mask structure is reduced. Further, the difference between the structure of the opening formed by wet etching and the designed opening structure is reduced.

To reduce the difference between the structure of the resist mask and the designed resist mask structure, the surface texture of the target surface of the nickel-containing metal sheet 11 preferably further satisfies [Condition 3] below.

[Condition 3] Difference in Reflectance Between Two Directions That Are Perpendicular to Each Other ≤3.6%

The two directions that are perpendicular to each other are in the target surface. The two directions that are perpendicular to each other include a first direction and a second direction. The difference in reflectance between two directions that are perpendicular to each other is the difference between the reflectance of the light emitted from the first direction and the reflectance of the light emitted from the second direction as viewed facing the target surface.

When the process of forming the nickel-containing metal sheet 11 includes rolling, the base material for forming the nickel-containing metal sheet 11 is rolled in one direction (a one-dimensional direction). As a result, of the directions in the target surface, the reflectance R of the target surface for the direction in which the base material is rolled differs from the reflectances R for the other directions.

When the process of forming the nickel-containing metal sheet 11 includes physical polishing or chemical mechanical polishing, the polishing progresses in one direction or in different directions. As a result, of the directions in the target surface, the reflectance R of the target surface for the direction in which the polishing progresses differs from the reflectances R for the other directions.

When the process of forming the nickel-containing metal sheet 11 includes the formation of metal foil by electrolysis, factors such as how the metal foil has developed or the surface condition of the electrode may cause the reflectance R of the target surface to vary depending on the direction of light incident on the target surface. The nickel-containing metal sheet 11 that satisfies [Condition 3] provides the effect of reducing the difference between the structure of the resist mask and the designed resist mask structure in the two-dimensional directions in the target surface. Since the anisotropy tends to occur depending on the electrolysis conditions, satisfying [Condition 3] increases the effect of reducing the difference between the structure of the resist mask and the designed resist mask structure.

Figure 2:
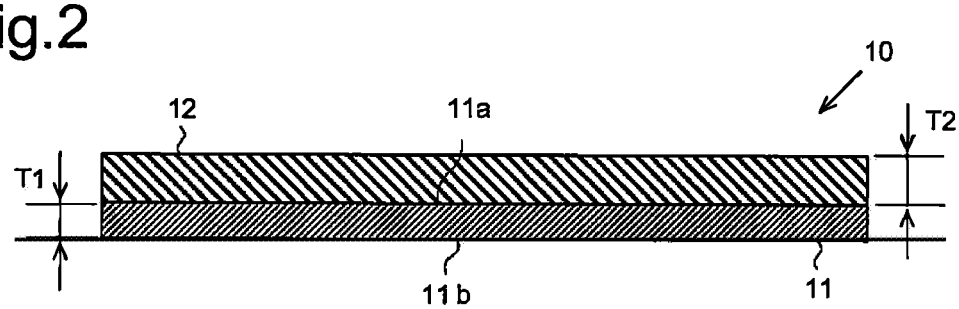
FIG. 2 is a cross-sectional view showing the cross-sectional structure of another example of a vapor deposition metal mask substrate of one embodiment.

As shown in FIG. 2, the vapor deposition metal mask substrate 10 may include a plastic support layer 12 in addition to the nickel-containing metal sheet 11. That is, the vapor deposition metal mask substrate 10 may be embodied as a laminate of the nickel-containing metal sheet 11 and the support layer 12. The support layer 12 may be made of a resist or polyimide, for example.

When the support layer 12 is made of a resist, the support layer 12 is a resist layer. The resist layer as the support layer 12 adheres to the substrate obverse surface 11a of the nickel-containing metal sheet 11, for example. In this case, the target surface of the nickel-containing metal sheet 11 includes at least the substrate obverse surface 11a. The resist layer as the support layer 12 may be formed as a sheet and then affixed to the substrate obverse surface 11a. Alternatively, the resist layer as the support layer 12 may be formed by applying coating liquid for forming the resist layer to the substrate obverse surface 11a.

When the support layer 12 is made of polyimide, the polyimide layer as the support layer 12 adheres to the substrate reverse surface 11b of the nickel-containing metal sheet 11. In this case, the target surface of the nickel-containing metal sheet 11 includes at least the substrate obverse surface 11a. The resist layer is located on the substrate obverse surface 11a of the nickel-containing metal sheet 11. The thermal expansion coefficient of polyimide and the temperature dependence of thermal expansion coefficient are equivalent to those of invar. This limits curling of the nickel-containing metal sheet 11, which would otherwise occur due to expansion or contraction of the support layer 12 caused by a change in the temperature of the support layer 12.

The support layer 12 has a thickness T2 of between 5 μm and 50 μm, inclusive. To increase the mechanical strength of the laminate of the support layer 12 and the nickel-containing metal sheet 11, the thickness T2 of the support layer 12 is preferably greater than or equal to 5 μm. In the process of manufacturing the vapor deposition metal mask, the support layer 12 may be removed from the nickel-containing metal sheet 11 by immersion in an alkaline solution, for example. The thickness of the support layer 12 is preferably less than or equal to 50 μm so as not to take an excessively long time for the removal.

[Method for Manufacturing Vapor Deposition Metal Mask Substrate]

The method for manufacturing a vapor deposition metal mask base is part of the method for manufacturing a vapor deposition metal mask. The method for manufacturing a vapor deposition metal mask substrate uses one of (A) electrolysis, (B) rolling and polishing, (C) electrolysis and polishing, and (D) rolling alone.

In forming a base material to be rolled to form the nickel-containing metal sheet 11, the oxygen trapped in the material for forming the base material to be rolled is usually removed. The removal of the oxygen contained in the material may involve mixing a deoxidizer, such as granular aluminum or magnesium, into the material for forming the base material. As a result, the base material includes aluminum or magnesium as a metallic oxide such as aluminum oxide or magnesium oxide. Most of the metallic oxide is removed from the base material before the base material is rolled, while some of the metallic oxide remains in the base material to be rolled. The metallic oxide remaining in the base material is one of the factors of the anisotropy of reflectance. In this respect, the manufacturing method that uses electrolysis limits the mixing of the metallic oxide into the nickel-containing metal sheet 11.

In the method for manufacturing a vapor deposition metal mask substrate including a support layer 12, a separate support layer 12 may be affixed to the target surface of the nickel-containing metal sheet 11, or a support layer 12 may be formed separately by applying a coating to the target surface of the nickel-containing metal sheet 11.

(A) Electrolysis

When the method for manufacturing the nickel-containing metal sheet 11 uses electrolysis, the nickel-containing metal sheet 11 is formed on the surface of an electrode for electrolysis. The nickel-containing metal sheet 11 is then removed from the surface of the electrode. The nickel-containing metal sheet 11 thus manufactured includes the target surface and the surface that is opposite to the target surface and has been in contact with the surface of the electrode. When the surface condition of the electrode is equivalent to the surface condition of the target surface of the nickel-containing metal sheet 11, both of the substrate obverse surface 11a and the substrate reverse surface 11b of the nickel-containing metal sheet 11 have the surface texture corresponding to the target surface. When the surface of the electrode has a greater surface roughness than the target surface of the nickel-containing metal sheet 11, or a lower reflectance than the nickel-containing metal sheet 11, the surface opposite to the surface that has been in contact with the electrode surface serves as the target surface of the nickel-containing metal sheet 11. The structure in which both of the substrate obverse surface 11a and the substrate reverse surface 11b have the surface texture corresponding to the target surface eliminates the need for distinguishing between the substrate obverse surface 11a and the substrate reverse surface 11b when forming a resist layer on the target surface. After removed from the electrode, the nickel-containing metal sheet 11 may be annealed.

The electrolytic bath for electrolysis contains an iron ion source, a nickel ion source, and a pH buffer, for example. The electrolytic bath used for electrolysis may also contain a stress relief agent, an $Fe^{3+}$ ion masking agent, and a complexing agent, such as malic acid or citric acid, and is a weakly acidic solution having a pH adjusted for electrolysis. Examples of the iron ion source include ferrous sulfate heptahydrate, ferrous chloride, and ferrous sulfamate. Examples of the nickel ion source include nickel (II) sulfate, nickel (II) chloride, nickel sulfamate, and nickel bromide. Examples of the pH buffer include boric acid and malonic acid. Malonic acid also functions as an $Fe^{3+}$ ion masking agent. The stress relief agent may be saccharin sodium, for example. The electrolytic bath used for electrolysis may be an aqueous solution containing additives listed above. The electrolytic bath is adjusted to have a pH of between 2 and 3, inclusive, for example, using a pH adjusting agent, such as 5% sulfuric acid or nickel carbonate.

The electrolysis conditions for electrolysis are conditions in which properties such as the surface texture of the target surface and the composition ratio of nickel in the nickel-containing metal sheet 11 are adjusted by the temperature of the electrolytic bath, current density, and electrolysis time. In particular, to manufacture the nickel-containing metal sheet 11 that satisfies [Condition 3] described above, factors such as the temperature of the electrolytic bath, current density, positioning of the electrode, method for agitating the electrolytic bath, and composition of electrolytic bath are adjusted so that electrolytic foil develops isotropically on the surface of the electrode. Further, to manufacture the nickel-containing metal sheet 11 that satisfies [Condition 3], a suitable brightening agent is added. The anode in the electrolysis conditions using the electrolytic bath may be pure iron and nickel. The cathode in the electrolysis conditions may a plate of stainless steel such as SUS304. The temperature of the electrolytic bath may be between 40° C. and 60° C., inclusive. The current density may be between 1 $A/dm^2$ and 4 $A/dm^2$, inclusive.

(B) Polishing

When the method for manufacturing the nickel-containing metal sheet 11 uses polishing, the nickel-containing metal sheet 11 to be polished may be manufactured by (A) electrolysis or rolling. When the nickel-containing metal sheet 11 to be polished is manufactured by rolling, the base material of nickel-containing metal is first rolled and then annealed. The level differences of the substrate obverse surface 11a of the nickel-containing metal sheet 11 before polishing are less than those of the obverse surface of the base material. The level differences of the substrate reverse surface 11b of the nickel-containing metal sheet 11 before polishing are less than those of the reverse surface of the base material. The target surface of the nickel-containing metal sheet 11 before polishing then undergoes a physical, chemical, chemical mechanical, or electric polishing process to become a smooth surface. The nickel-containing metal sheet 11 including the target surface is thus manufactured.

The polishing liquid used for chemical polishing may be a chemical polishing liquid for an iron-based alloy that contains hydrogen peroxide as the main component. The electrolyte used for electrical polishing is a perchloric acid-based electropolishing solution or a sulfuric acid-based electropolishing solution. The nickel-containing metal sheet 11 before polishing may also be embodied as a nickel-containing metal sheet 11 that is rolled and then wet etched to be thinner with an acidic etching solution.

[Vapor Deposition Metal Mask]

Figure 3:
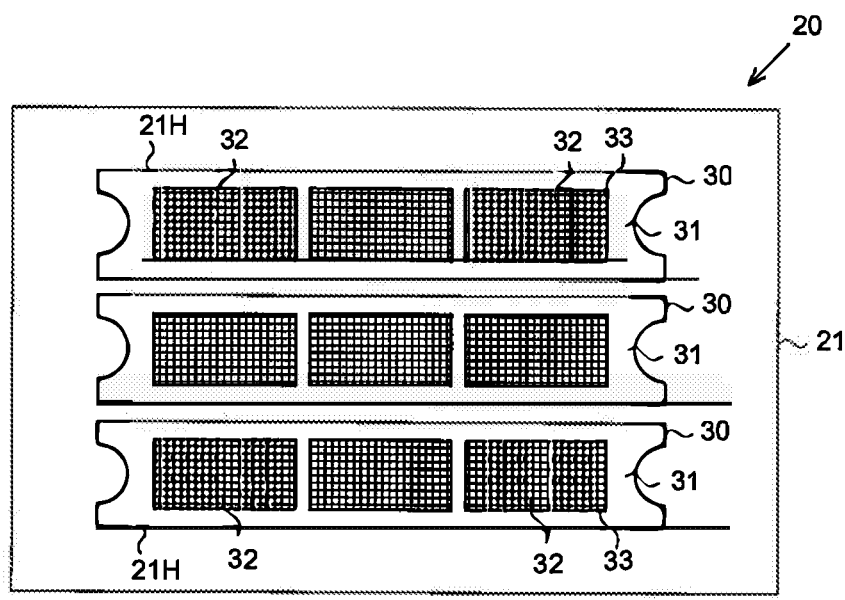
FIG. 3 is a plan view showing the planar structure of a mask device of one embodiment.

As shown in FIG. 3, a mask device 20 includes a main frame 21 and a plurality of vapor deposition metal masks 30. The main frame 21 is a frame-shaped plate supporting the vapor deposition metal masks 30. The main frame 21 is attached to a vapor deposition apparatus for vapor deposition. The main frame 21 includes a plurality of main frame holes 21H. Each main frame hole 21H extends over substantially the entire section to which the corresponding vapor deposition metal mask 30 is attached. The main frame holes 21H extend through the main frame 21.

Each vapor deposition metal mask 30 includes a sub-frame 31 and a plurality of mask portions 32. The sub-frame 31 is a frame-shaped plate supporting the mask portions 32. The sub-frame 31 is attached to the main frame 21. The sub-frame 31 includes a plurality of sub-frame holes 33. Each sub-frame hole 33 extends over substantially the entire section to which the corresponding mask portion 32 is attached. The sub-frame holes 33 extend through the sub-frame 31. Each mask portion 32 is fixed to the rim defining the corresponding sub-frame hole 33 by welding or adhesion. An example of the cross-sectional structure of the mask portion 32 is now described with reference to FIG. 4, and another example of the cross-sectional structure of the mask portion 32 is described with reference to FIG. 5.

Figure 4:
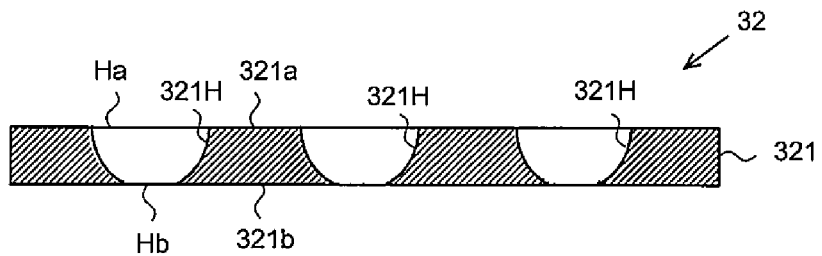
FIG. 4 is a cross-sectional view partially showing an example of the cross-sectional structure of a vapor deposition metal mask of one embodiment.

Referring to FIG. 4, each mask portion 32 is composed of a nickel-containing metal sheet 321. The material forming the nickel-containing metal sheet 321 is substantially the same as the material forming the nickel-containing metal sheet 11 of the vapor deposition metal mask substrate 10 described above. The nickel-containing metal sheet 321 is manufactured by forming mask holes 321H in the nickel-containing metal sheet 11. The nickel-containing metal sheet 321 includes a mask obverse surface 321a and a mask reverse surface 321b, which is opposite to the mask obverse surface 321a. At least one of the mask obverse surface 321a and the mask reverse surface 321b is the target surface on which a resist layer has been placed. The mask obverse surface 321a is the surface that faces the vapor deposition source in the vapor deposition apparatus. The mask reverse surface 321b is the surface that is in contact with the vapor deposition target, such as a glass substrate, in the vapor deposition apparatus. The surface texture of the target surface of the nickel-containing metal sheet 321 is substantially the same as the surface texture of the target surface of the nickel-containing metal sheet 11. The region in the target surface of the nickel-containing metal sheet 321 that is free of the mask holes 32H has a surface texture that satisfies at least one of [Condition 1] and [Condition 2] described above. In addition, the region in the target surface of the nickel-containing metal sheet 321 that is free of the mask holes 32H preferably has a surface texture that satisfies [Condition 3] described above.

The mask portion 32 includes a plurality of mask holes 321H extending through the nickel-containing metal sheet 321. The hole side surface defining each mask hole 321H has a curved cross-sectional shape in the thickness direction of the nickel-containing metal sheet 321. The hole side surface gently curves from the mask obverse surface 321a to the mask reverse surface 321b. The mask obverse surface 321a includes obverse surface openings Ha that are openings of the mask holes 321H. The mask reverse surface 321b includes reverse surface openings Hb that are openings of the mask holes 321H. The obverse surface openings Ha are larger in size than the reverse surface openings Hb as viewed from above. Each mask hole 321H is a passage for the vapor deposition particles sublimated from the vapor deposition source. The vapor deposition particles sublimated from the vapor deposition source travel from the obverse surface openings Ha toward the reverse surface openings Hb. The mask hole 321H having the obverse surface opening Ha that is larger than the reverse surface opening Hb reduces the shadow effect of the vapor deposition particles entering through the obverse surface opening Ha.

When the mask holes 321 H are formed in the nickel-containing metal sheet 11 of the vapor deposition metal mask substrate 10, of the substrate obverse surface 11a and the substrate reverse surface 11b, the surface that is etched to a greater degree has larger openings than the surface that is etched to a lesser degree. Since the vapor deposition metal mask 30 has the obverse surface openings Ha that are larger than the reverse surface openings Hb, the degree of etching on the substrate obverse surface 11a is set to be greater than the degree of etching on the substrate reverse surface 11b. When the substrate obverse surface 11a is the target surface, the vapor deposition metal mask 30 may be manufactured by forming a resist mask on the substrate obverse surface 11a and etching the nickel-containing metal sheet 11 from the substrate obverse surface 11a. This limits scattering of light on the target surface for placing the resist mask. Consequently, the difference between the structure of the resist mask formed by exposure and development and the designed resist mask structure is reduced. This enhances the structural accuracy of the mask holes 321H of the vapor deposition metal mask 30. In particular, the target surface that satisfies [Condition 3] enhances the structural accuracy of the mask holes 321H in the two-dimensional directions in the target surface.

Figure 5:
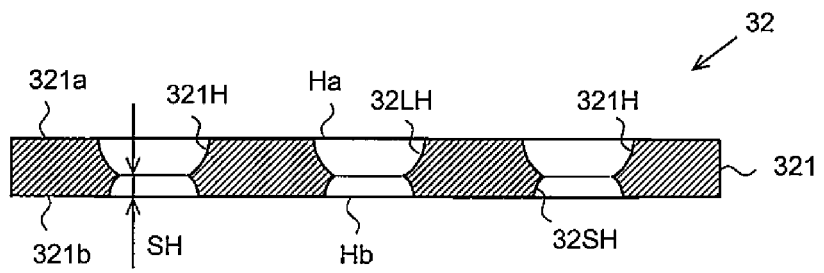
FIG. 5 is a cross-sectional view partially showing another example of the cross-sectional structure of a vapor deposition metal mask of one embodiment.

In another example shown in FIG. 5, each mask portion 32 includes a plurality of mask holes 321H extending through the nickel-containing metal sheet 321. The obverse surface openings Ha are larger than the reverse surface openings Hb as seen from above also in the example shown in FIG. 5. Each mask hole 321 H includes a mask large hole 32LH having an obverse surface opening Ha and a mask small hole 32SH having a reverse surface opening Hb. The mask large hole 32LH is a hole whose cross-sectional area monotonously decreases from the obverse surface opening Ha toward the mask reverse surface 321b. The mask small hole 32SH is a hole whose cross-sectional area monotonously decreases from the reverse surface opening Hb toward the mask obverse surface 321a.

The hole side surface defining each mask hole 321H has a section where the mask large hole 32LH is connected to the mask small hole 32SH as seen in a cross-sectional view. The section where the mask large hole 32LH is connected to the mask small hole 32SH is located in the middle area in the thickness direction of the nickel-containing metal sheet 321. The section where the mask large hole 32LH is connected to the mask small hole 32SH protrudes inward of the mask hole 321H. The distance between the mask reverse surface 321b and the section where the hole side surface defining the mask hole 321H protrudes to the greatest extent is a step height SH. The cross-sectional structure described above with reference to FIG. 4 is an example in which the step height SH is zero. To limit the shadow effect described above, the step height SH is preferably zero. In order to obtain a mask portion 32 having zero step height SH, the nickel-containing metal sheet 11 preferably has a thickness of less than or equal to 40 µm so that the mask holes 321 H are formed by wet etching from the substrate obverse surface 11a to the substrate reverse surface 11b, eliminating the need for wet etching from the substrate reverse surface 11b. For this reason, the vapor deposition metal mask substrate 10 that is manufactured using (A) electrolysis, (B) rolling and polishing, or (C) electrolysis and polishing is advantageous.

To form the mask large holes 32LH in the nickel-containing metal sheet 11, the nickel-containing metal sheet 11 is etched from the substrate obverse surface 11a. To form the mask small holes 32SH in the nickel-containing metal sheet 11, the nickel-containing metal sheet 11 is etched from the substrate reverse surface 11b. The structure in which the substrate obverse surface 11a is a target surface and the substrate reverse surface 11b is also a target surface limits scattering of light on the target surfaces for placing resist masks. This further enhances the structural accuracy of the mask holes 321H of the vapor deposition metal mask 30.

[Method for Manufacturing Vapor Deposition Metal Mask]

The method for manufacturing the vapor deposition metal mask 30 described with reference to FIG. 4 and the method for manufacturing the vapor deposition metal mask 30 described with reference to FIG. 5 are substantially identical in steps except for the step of wet etching the nickel-containing metal sheet 11. Thus, the method for manufacturing the vapor deposition metal mask 30 described with reference to FIG. 4 is mainly described below, and the overlapping part of the method for manufacturing the vapor deposition metal mask 30 described with reference to FIG. 5 is not described.

Figure 6:
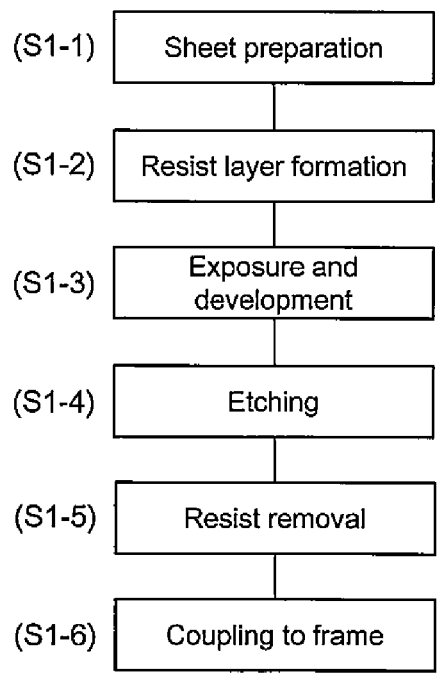
FIG. 6 is a process flow chart showing the flow of steps in a method for manufacturing a vapor deposition metal mask.

As shown in FIG. 6, the method for manufacturing a vapor deposition metal mask first prepares a nickel-containing metal sheet 11 by a process such as (A) electrolysis or (B) rolling and polishing described above (Step S1-1). Next, the method forms a resist layer on one of the target surfaces of the nickel-containing metal sheet 11 (Step S1-2) and forms a resist mask on the target surface by performing exposure and development of the resist layer (Step S1-3).

The method then forms mask holes 321H in the nickel-containing metal sheet 11 by wet etching the target surface using the resist mask (Step S1-4). The resist mask is then removed from the target surface so that the mask portions 32 are manufactured (Step S1-5). The method then fixes the mask obverse surfaces 321a of the mask portions 32 to a sub-frame 31 to manufacture the vapor deposition metal mask (Step S1-6).

The etching solution for etching the nickel-containing metal sheet 11 may be any acidic etching solution that is capable of etching invar. The acidic etching solution is, for example, a solution containing perchloric acid, hydrochloric acid, sulfuric acid, formic acid, or acetic acid mixed in a ferric perchlorate solution or a mixture of a ferric perchlorate solution and a ferric chloride solution. The etching of the target surface may be performed by a dipping method in which the nickel-containing metal sheet 11 is immersed in an acidic etching solution, or by a spraying method in which an acidic etching solution is sprayed onto the target surface of the nickel-containing metal sheet 11. Alternatively, the etching of the target surface may be performed by a spinning method in which an acidic etching solution is trickled onto the nickel-containing metal sheet 11 that is rotated by a spinner.

When the resist layer on the target surface is illuminated with light, it is less likely that part of the light will scatter on the target surface and fall on the non-exposure region of the resist layer. Consequently, the difference between the structure of the resist mask formed by exposure and development and the designed resist mask structure is reduced. This enhances the structural accuracy of the mask holes 321H of the nickel-containing metal sheet 321. The resist layer may be formed on the target surface by forming a sheet-shaped resist layer and affixing the formed resist layer to the target surface, or by applying a coating liquid for forming a resist layer to the target surface.

In the method for manufacturing the vapor deposition metal mask 30 described with reference to FIG. 5, Steps S1-1 to S1-5 are performed on the substrate obverse surface 11a corresponding to the mask obverse surface 321a, thereby forming the mask large holes 32LH. The mask large holes 32LH are then filled with a resist or the like to protect the mask large holes 32LH. Then, Steps S1-2 to S1-5 are performed on the substrate reverse surface 11b corresponding to the mask reverse surface 321b, thereby forming the mask small holes 32SH. The mask portions 32 are thus obtained. The mask obverse surfaces 321a of the mask portions 32 are fixed to a sub-frame 31 to manufacture the vapor deposition metal mask (Step S1-6).

When the vapor deposition metal mask substrate 10 includes a support layer 12 made of polyimide, the support layer 12 is removed from the vapor deposition metal mask substrate 10 after Step S1-5. The support layer 12 may be removed by peeling using laser irradiation, chemical dissolution or peeling, or physical peeling, for example. Alternatively, when the vapor deposition metal mask substrate 10 includes a support layer 12 made of polyimide, the support layer 12 may be coupled to the sub-frame 31 as a component of the vapor deposition metal mask. A method of chemically removing the support layer 12 does not apply external force to the nickel-containing metal sheet 11, reducing the likelihood that the nickel-containing metal sheet 11 has creases or distortion, as compared to physically peeling the support layer 12 from the nickel-containing metal sheet 11. The method of chemically removing the support layer 12 from the vapor deposition metal mask substrate 10 preferably uses an alkaline solution that dissolves the support layer 12 to peel the support layer 12 from the nickel-containing metal sheet 11, for example.

Test Examples

Figure 8:
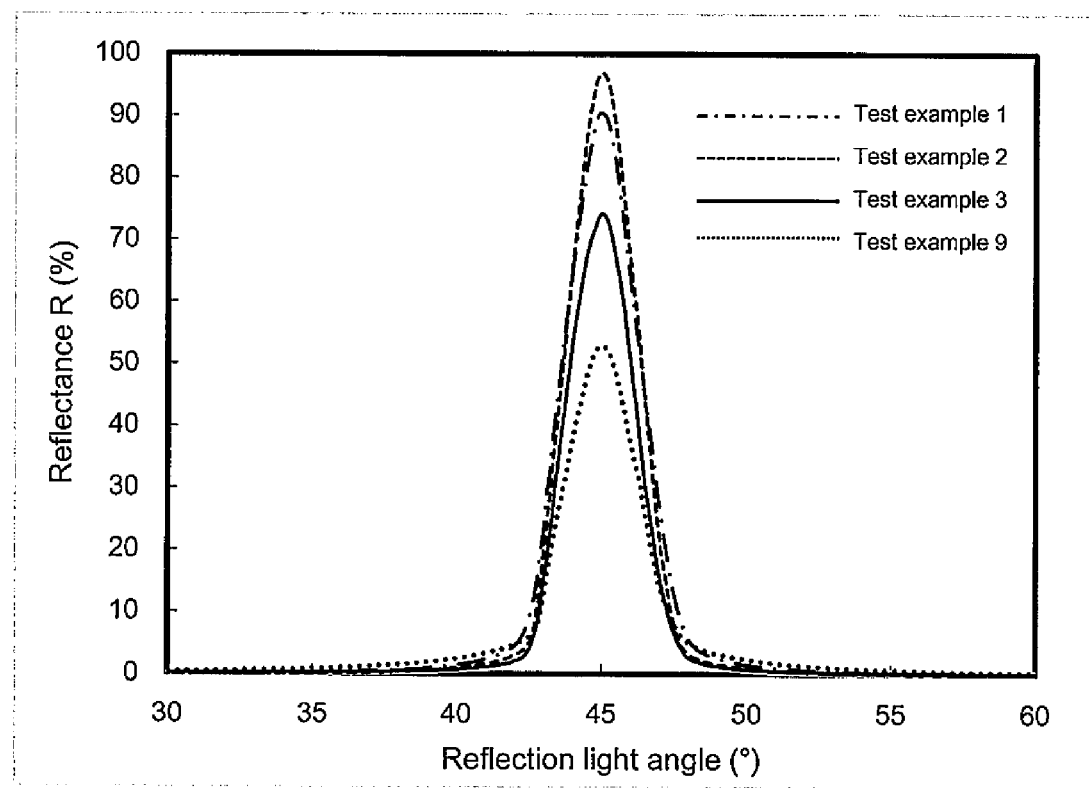
FIG. 8 is a graph showing the reflectance of the target surface of the vapor deposition metal mask substrate of each test example.

Referring to FIGS. 7 and 8, the surface roughness Sa and Sz, reflectance R, reflectance difference, and processing accuracy of the resist mask of the vapor deposition metal mask substrate 10 are now described. FIG. 7 shows the surface roughness Sa and Sz, reflectance R, and reflectance difference in levels of Test Examples 1 to 9. FIG. 8 shows the angular dependence of the reflectances of Test Examples 1, 2, 3, and 9, which are representative examples among the reflectances measured for Test Examples 1 to 9.

As shown in FIG. 7, Test Examples 1, 2, 3, 6 and 7 are vapor deposition metal mask substrates 10 that were manufactured by (A) electrolysis and had a thickness of 20 µm. Test Examples 4 and 5 are vapor deposition metal mask substrates 10 that were manufactured by (B) rolling and polishing and had a thickness of 20 μm. For the vapor deposition metal mask substrates 10 that were manufactured by (A) electrolysis, the surface texture of the surfaces that had been in contact with electrodes are indicated as the surface texture corresponding to the target surfaces. The surface roughness Sa of the SUS electrode was 0.018 μm, and the surface roughness Sz was 0.170 μm. Test Examples 8 and 9 are vapor deposition metal mask substrates 10 that were formed by rolling. These vapor deposition metal mask substrate 10 were not polished. The thickness of Test Examples 8 and 9 was greater than the thickness of Test Examples 4 and 5 by 10 μm, which was the amount of polishing in Test Examples 8 and 9.

Each of Test Examples 1, 2, 3, 6 and 7 was obtained by using an electrolytic bath that was an aqueous solution to which the following additives were added. The electrolytic bath was adjusted to have a pH of 2.3. Test Examples 1, 2, 3, 6 and 7 were obtained by varying the current density within the range between 1 ($A/dm^2$) and 4 ($A/dm^2$), inclusive. Test Examples 1, 2, 3, 6 and 7 differ from one another in the composition ratio between iron and nickel.

Electrolyte for Test Examples
Ferrous sulfate heptahydrate: 83.4 g
Nickel sulfate(II) hexahydrate: 250.0 g
Nickel(II) chloride hexahydrate: 40.0 g
Boric acid: 30.0 g
Saccharin sodium dihydrate: 2.0 g
Malonic acid: 5.2 g
Temperature: 50° C.

Each of Test Example 4 and Test Example 5 was obtained by subjecting an unpolished nickel-containing metal sheet 11 formed by rolling to chemical polishing using a hydrogen peroxide-based chemical polishing liquid.

Test Examples 8 and 9 are the nickel-containing metal sheets 11 that are similar to those of Test Examples 4 and 5, which were obtained by rolling and polishing, except that Test Examples 8 and 9 were not polished. Test Examples 8 and 9 are of levels that are not chemically polished.

In the levels of each of Test Examples 1 to 7, the surface roughness Sa of the target surface was less than or equal to 0.019 μm, and the surface roughness Sz of the target surface was less than or equal to 0.308 μm. In contrast, in the levels of each of Test Examples 8 and 9, the surface roughness Sa of the target surface was about 0.04 μm. This indicates that the vapor deposition metal mask substrate that is manufactured by (A) electrolysis or (B) polishing has a significantly lower surface roughness Sa. In addition, in the levels of Test Examples 8 and 9, the surface roughness Sz of the target surface was substantially greater than or equal to 0.35 μm. This indicates that the vapor deposition metal mask substrates that are manufactured by (A) electrolysis or (B) polishing have a significantly low surface roughness Sz.

As shown in FIGS. 7 and 8, in the levels of Test Examples 1 to 3, the reflectances R were between 53.0% and 97.0%, inclusive. In contrast, Test Examples 8 and 9 had a reflectance R of less than 53.0% and had a greater half bandwidth than the other test examples. This indicates that the vapor deposition metal mask substrate manufactured by (A) electrolysis or (B) polishing achieves a high reflectance R of 53.0% or greater.

In the levels of each of Test Examples 1 to 3, the reflectance difference between two directions that are perpendicular to each other was less than or equal to 2.7%. In Test Example 5, the reflectance difference between two directions that are perpendicular to each other was 3.6%. In contrast, the reflectance difference of Test Example 9 was 6.2%, and the reflectance difference of Test Example 6, which was different from Test Examples 1 to 3 in electrolysis conditions, was 6.5%. This indicates that a low reflectance difference, which cannot be achieved by rolling, can be achieved by adjusting the temperature and current density of the electrolytic bath for (A) electrolysis.

The sizes of minimum resolutions of the resist masks formed on the target surfaces of Test Examples 1 to 7 varied within the range of 4 μm to 5 μm when circular holes were formed in the resist layers by exposure to ultraviolet light. In particular, Test Examples 1 to 3 and 5, in which the reflectance differences were less than or equal to 3.6%, had smaller variations than Test Examples 6 and 7 in the sizes of minimum resolutions in the two-dimensional directions in the target surface. Specifically, Test Examples 1 to 3, in which the reflectance differences were less than or equal to 2.7%, had smaller minimum resolutions than Test Example 5, in which the reflectance difference was less than or equal to 3.6%. The minimum resolutions of the resist masks formed on the surfaces of Test Examples 8 and 9 in the same manner were greater than or equal to 7 μm when circular holes were formed in the resist layers by exposure to ultraviolet light. Therefore, in order to increase the structural accuracy of the openings of the vapor deposition metal mask, the reflectance difference is preferably less than or equal to 3.6%, more preferably less than or equal to 2.7%.

The embodiment described above may be modified as follows.

In manufacturing the vapor deposition metal mask substrate by electrolysis, the pattern of the mask for the nickel-containing metal sheet 11 may be formed in advance on the surface of the electrode. In this manufacturing method, the nickel-containing metal sheet 11 is formed on the section of the surface of the electrode that is free of the pattern. After the nickel-containing metal sheet 11 is formed on the surface of the electrode, the pattern is dissolved or otherwise removed from the electrode surface. The nickel-containing metal sheet is then removed from the electrode surface. The vapor deposition metal mask substrate is thus manufactured. The pattern that is preformed on the electrode surface may be any pattern that limits the development of the nickel-containing metal sheet 11 on the pattern. A resist pattern may be used, for example.

Such a method for manufacturing a vapor deposition metal mask substrate allows the formation of holes and recesses in the section of the vapor deposition metal mask substrate 10 that corresponds to the pattern. This achieves the alignment between the structure of the pattern formed on the electrode surface and the structure of the holes, such as mask holes. The method may reduce time and effort required for wet etching the vapor deposition metal mask substrate 10. Further, the method will even eliminate the need for the wet etching process.

In Steps S1-6, instead of the mask obverse surfaces 321a of the mask portions 32, the mask reverse surfaces 321b of the mask portions 32 may be fixed to the sub-frame 31. That is, the vapor deposition metal mask may be either of a structure in which the mask obverse surfaces 321a are fixed to the sub-frame 31 and a structure in which the mask reverse surfaces 321b are fixed to the sub-frame 31.

In the method for manufacturing the vapor deposition metal mask 30 described referring to FIG. 5, the step of forming the mask large holes 32LH may be performed after the step of forming the mask small holes 32SH.

DESCRIPTION OF THE REFERENCE NUMERALS

10: vapor deposition metal mask substrate, 11 and 321: nickel-containing metal sheet, 11a: substrate obverse surface, 11*b*: substrate reverse surface, 12: support layer, 20: mask device, 21H: main frame hole, 30: vapor deposition metal mask, 31: sub-frame, 32: mask portion, 321H: mask hole, 32LH: mask large hole, 32SH: mask small hole, 33: sub-frame hole, 321: nickel-containing metal sheet, 321*a*: mask obverse surface, 321*b*: mask reverse surface

The invention claimed is:

1. A vapor deposition metal mask comprising a mask portion composed of a nickel-containing metal sheet, wherein
the mask portion includes
an obverse surface including an obverse surface opening, and
a reverse surface including a reverse surface opening in communication with the obverse surface opening, the reverse surface being opposite to the obverse surface,
at least one of the obverse surface or the reverse surface is a target surface,
the target surface has a surface roughness Sa of less than or equal to 0.019 μm,
the target surface has a surface roughness Sz of less than or equal to 0.308 μm,
the nickel-containing metal sheet is made of invar, and has a thickness of between 2 μm and 40 μm inclusive, and
a specular reflectance of incident light to the target surface is between 53.0% and 97.0%, inclusive.

2. The vapor deposition metal mask according to claim 1, wherein
two directions that are perpendicular to each other in the target surface are directions in which light is incident as viewed facing the target surface, and
a difference in the reflectance between the two directions is less than or equal to 3.6%.

3. The vapor deposition metal mask according to claim 1, wherein
the target surface includes at least the obverse surface, and
the obverse surface opening is an opening for passage of vapor deposition particles from the obverse surface opening toward the reverse surface opening and is larger than the reverse surface opening.

4. The vapor deposition metal mask according to claim 1, wherein the nickel-containing metal sheet has an elongated shape.

5. The vapor deposition metal mask according to claim 1, wherein the nickel-containing metal sheet is rolled in a one-dimensional direction.

6. The vapor deposition metal mask according to claim 1, wherein the nickel-containing metal sheet includes granular aluminum oxide or magnesium oxide.

7. The vapor deposition metal mask according to claim 1, wherein the nickel-containing metal sheet does not include granular aluminum oxide and magnesium oxide.

8. A method for manufacturing a vapor deposition metal mask according to claim 1, the method comprising:
forming a nickel-containing metal sheet on an electrode surface by electrolysis; and
separating the nickel-containing metal sheet from the electrode surface, wherein
the nickel-containing metal sheet includes an obverse surface and a reverse surface, which is opposite to the obverse surface,
at least one of the obverse surface or the reverse surface is a target surface for placing a resist layer,
the electrolysis causes the target surface to have a surface roughness Sa of less than or equal to 0.019 μm and causes the target surface to have a surface roughness Sz of less than or equal to 0.308 μm,
the electrolysis further causes the nickel-containing metal sheet to have a thickness of between 2 μm and 40 μm, inclusive, and causes the nickel-containing metal sheet to have a specular reflectance of incident light to the target surface is between 53.0% and 97.0%, inclusive.

9. A method for manufacturing a vapor deposition metal mask according to claim 1, the method comprising:
forming a resist mask on a target surface of a vapor deposition metal mask substrate; and
etching the target surface by wet etching using the resist mask.

* * * * *